(12) United States Patent
Douyou (10) Patent No.: US 11,754,893 B2
(45) Date of Patent: Sep. 12, 2023

(54) DISPLAY DEVICE

(71) Applicant: Japan Display Inc., Tokyo (JP)

(72) Inventor: Mamoru Douyou, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 17/743,464

(22) Filed: May 13, 2022

(65) Prior Publication Data

US 2022/0365397 A1 Nov. 17, 2022

(30) Foreign Application Priority Data

May 13, 2021 (JP) .................................. 2021-081613

(51) Int. Cl.
*G02F 1/1362* (2006.01)
*G02F 1/1368* (2006.01)
*G09G 3/36* (2006.01)
*H01L 27/12* (2006.01)

(52) U.S. Cl.
CPC .... *G02F 1/136209* (2013.01); *G02F 1/13685* (2021.01); *G02F 1/136286* (2013.01); *G09G 3/3648* (2013.01); *G09G 2300/0426* (2013.01); *G09G 2310/0202* (2013.01); *G09G 2310/08* (2013.01); *H01L 27/124* (2013.01)

(58) Field of Classification Search
CPC .................................................... G02F 1/1362
See application file for complete search history.

(56) References Cited

U.S. PATENT DOCUMENTS

| 6,330,044 | B1 * | 12/2001 | Murade | G02F 1/136209 349/110 |
|---|---|---|---|---|
| 2016/0209719 | A1 * | 7/2016 | Yamaguchi | G02F 1/134309 |
| 2021/0302796 | A1 * | 9/2021 | Ikeda | G02F 1/1334 |

FOREIGN PATENT DOCUMENTS

| JP | 2002-221738 A | 8/2002 |
|---|---|---|
| JP | 2016-134388 A | 7/2016 |

* cited by examiner

*Primary Examiner* — Sang V Nguyen
(74) *Attorney, Agent, or Firm* — XSENSUS LLP (57) ABSTRACT

According to one embodiment, a display device includes signal lines, and a signal line switching circuit connected to the signal lines. The signal line switching circuit includes a plural first lines each extending in a first direction and disposed at intervals in a second direction, a plural transistors apart from the first lines in the second direction and arranged in the first direction, each transistor including a gate electrode and a light shielding layer disposed to overlap with the gate electrode, and a plural second lines connecting the transistors to the first lines. The light shielding layer includes an extension part extending to an area where the first line does not exist, and is electrically connected to the gate electrode.

7 Claims, 6 Drawing Sheets

FIG. 10 ically in the drawings as compared with those in an accurate representation. Constituent elements corresponding to each other in a plurality of drawings are denoted by the same reference numerals and their detailed descriptions may be omitted unless necessary.

DISPLAY DEVICE

CROSS-REFERENCE TO RELATED APPLICATIONS

This application is based upon and claiming the benefit of priority from Japanese Patent Application No. 2021-081613, filed May 13, 2021, the entire contents of which are incorporated herein by reference.

FIELD

Embodiments described herein relate generally to a display device.

BACKGROUND

Display devices using a light shielding layer as a back gate have been developed.

In such display devices, a plurality of signal line switching circuits are arranged on a substrate, and multiple lines of the signal line switching circuits are arranged in substantially parallel. A contact part of the back gate extended from a transistor and a gate electrode is positioned to overlap with the multiple lines.

DETAILED DESCRIPTION

Various embodiments will be described hereinafter with reference to the accompanying drawings. In general, according to one embodiment, a display device comprises a plurality of signal lines, and a signal line switching circuit connected to the signal lines. The signal line switching circuit comprises a plurality of first lines each extending in a first direction and disposed at intervals in a second direction intersecting the first direction, a plurality of transistors apart from the first lines in the second direction and arranged in the first direction, each transistor including a gate electrode and a light shielding layer disposed to overlap with the gate electrode, and a plurality of second lines connecting the transistors to the first lines. The light shielding layer of the transistor includes an extension part extending from the light shielding layer to an area where the first line does not exist, and is electrically connected to the gate electrode at a position of the extension part.

The disclosure is merely an example, and any modification which is easily conceivable by a person of ordinary skill in the art comes within the concept of the invention is naturally encompassed within the scope of the invention as a matter of course. Furthermore, in order to make the description clearer, the sizes, shapes and the like of the respective parts may be changed and illustrated schematically in the drawings as compared with those in an accurate representation. Constituent elements corresponding to each other in a plurality of drawings are denoted by the same reference numerals and their detailed descriptions may be omitted unless necessary.

First Embodiment

Hereinafter, a display device of a first embodiment will be explained with reference to the drawings.

In this embodiment, first direction X, second direction Y, and third direction Z are orthogonal to each other, but they may intersect at an angle other than 90 degrees. The direction toward the tip of the arrow of the third direction Z will be defined as up or above, and the direction opposite to the direction toward the tip of the arrow of the third direction Z will be defined as down or below.

An observation position for observing the display device is hypothetically placed at the tip of the arrow of the third direction Z, and viewing from this observation position toward the X-Y plane defined by the first direction X and the second direction Y will be referred to as plan view. Viewing the X-Z plane defined by the first direction X and the third direction Z, or the X-Y plane defined by the second direction Y and the third direction Z will be defined as cross-sectional view.

Figure 1:
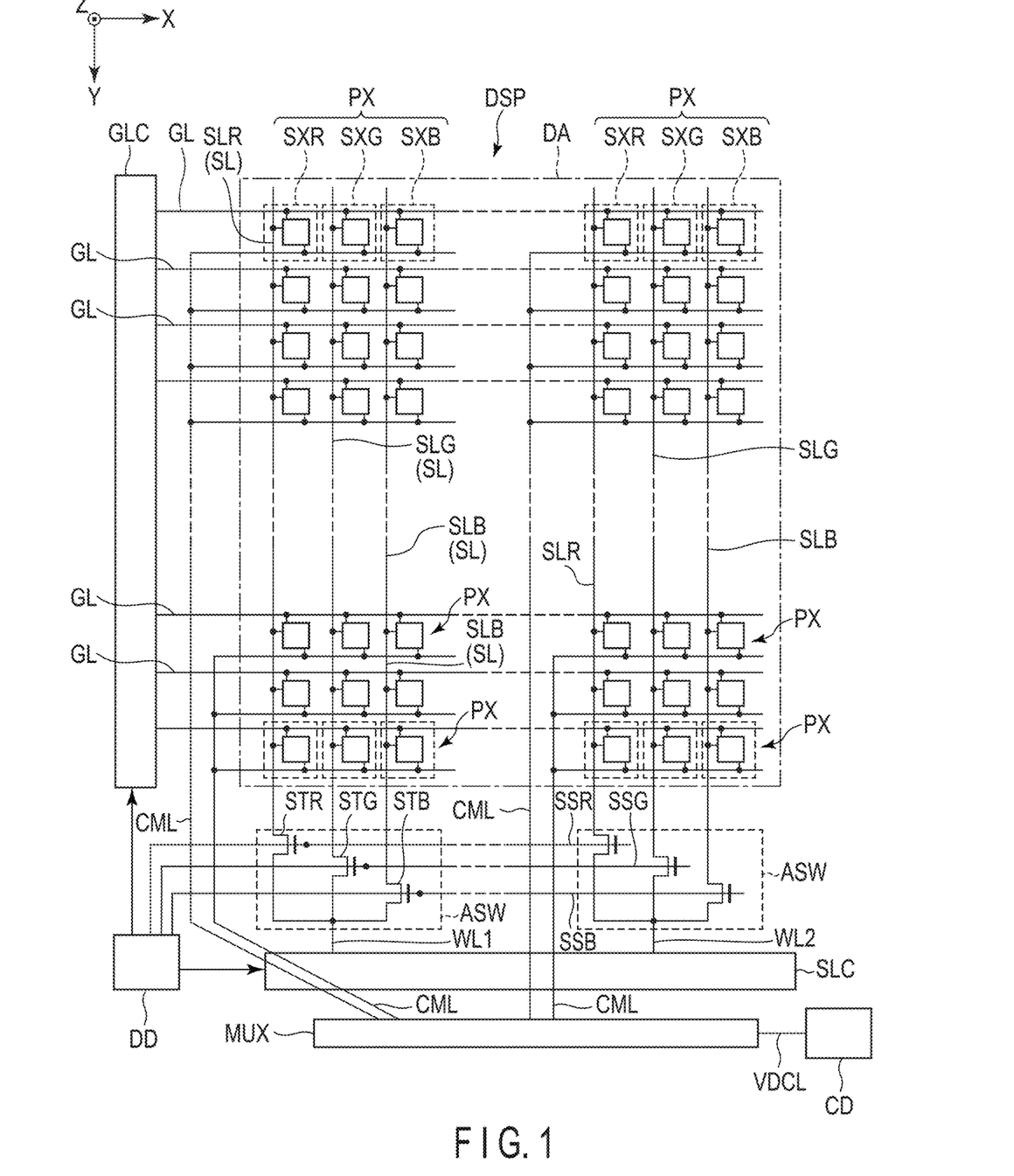
FIG. 1 is a circuit diagram of a display device of a first embodiment.

FIG. 1 is a schematic plan view of the display device of the first embodiment. A liquid crystal display is shown as an example of the display device. As shown in the figure, the display device DSP has a display area DA formed on a substrate (base material) and a non-display area (bezel area) located around the display area, which will be described later.

The display area DA includes a plurality of pixels PX, a plurality of scan lines GL, a plurality of signal lines SL. The scan lines GL extend in the first direction X and are arranged at intervals in the second direction Y. The signal lines SL extend in the second direction Y and are arranged at intervals in the first direction X. Note that, the scan line and signal line may be referred to as gate line and source line, respectively.

Each of pixels PX includes subpixels SXR, SXG, and SXB, which display the respective colors R (red), G (green), and B (blue). When subpixels SXR, SXG, and SXB are not distinguished, they are simply referred to as subpixels SX. A plurality of subpixels SX are arranged in a matrix in the first direction X and second direction Y, and are each located near the intersection of scan lines GL and signal lines SL. In other words, each subpixel SX is placed in the area surrounded by two adjacent scan lines GL and two adjacent signal lines SL.

Figure 2:
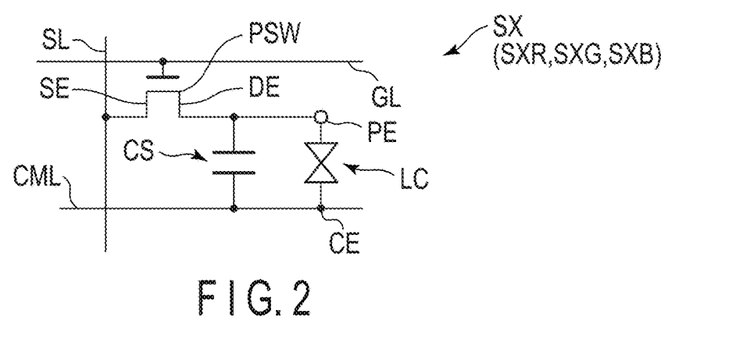
FIG. 2 is a schematic view of an example of a pixel of the display device.

FIG. 2 is a circuit diagram of a subpixel SX.

As in the figure, each subpixel SX has a switching element PSW, pixel electrode PE, common electrode CE, liquid crystal layer LC, capacitance CS, etc. The switching element SW includes a thin-film transistor (TFT), for example, and is electrically connected to the scan line GL and the signal line SL. The scan line GL is connected to the gate electrode GE of the switching element SW in each of the subpixels SX aligned in the first direction X. The signal line SL is electrically connected to the source electrode SE of the switching element PSW in each of the subpixels SX aligned in the second direction Y. The pixel electrode PE is electrically connected to the drain electrode DE of the switching element PSW. Each of the pixel electrodes PE is opposed to the common electrode CE, and drives the liquid crystal layer LC by an electric field generated between the pixel electrodes PE and the common electrode CE. The capacitance CS is, for example, formed between an electrode of the same potential as the common electrode CE and an electrode with the same potential as the pixel electrode PE.

The source electrode SE of the switching element PSW of the subpixel SX is formed integrally with the signal line SL. Furthermore, each of the of signal lines SL is connected to a signal line drive circuit SLC, which will be described later, to which the video signal supplied to each subpixel SX is input. In other words, the signal lines SL connect the subpixels SX to the signal line drive circuit SLC. The gate electrode GE of the switching element PSW is formed integrally with the scan line GL. Furthermore, each scan line GL is connected to the scan line drive circuit GLC, which will be described later, which supplies scan signals to each subpixel SX. The common electrode CE is connected to a common line CML.

On the other hand, as in FIG. 1, the display unit DSP includes a scan line drive circuit GLC which drives the scan line GL, signal line drive circuit SLC which drives the signal line SL, signal line switching circuit ASW, common electrode drive circuit CD which drives the common electrode CE, and switch circuit MUX connected to the common line CML. The signal line drive circuit SLC and the scan line drive circuit GLC are electrically connected to the drive device (control circuit) DD. The drive device DD outputs signals necessary for image display to the subpixels SX via the signal line drive circuit SLC and the scan line drive circuit GLC.

As described in detail below, between the signal line drive circuit SLC and the drive device DD, a plurality of drawer lines WL1 and WL2 electrically connected to the signal lines SL are disposed.

A connection relationship between the signal line SL and the signal line switching circuit ASW will be explained. In the example of FIG. 1, the signal lines SLR, SLG, and SLB are provided as signal lines SL connected to each of the subpixels SX. The signal lines SLR, SLG, and SLB are connected to the signal line switching circuit ASW. The signal line SLR is a signal line connected to the subpixel SXR which displays red (R) color. The signal line SLG is a signal line connected to the subpixel SKG which displays green (G) color. The signal line SLB is a signal line connected to the subpixel SXB which displays blue (B) color.

The signal line SLR is connected to a sub-pixel row including a plurality of subpixels SXR arrayed in the second direction Y. The signal line SLG is connected to a sub-pixel row including a plurality of subpixels SXG arrayed in the second direction Y. The signal line SLB is connected to a sub-pixel row including a plurality of subpixels SXB arrayed in the second direction Y.

The signal line switching circuit ASW is a control circuit which supplies signals related to images to the display area DA as a pixel circuit. The signal line switching circuit ASW may include transistors STR, STG, and STB, as switching elements, and selection lines SSR, SSG, and SSB. Each of the transistors STR, STG, and STB is, for example, a thin-film transistor. If there is no need to distinguish between the transistors STR, STG, and STB, they will be simply referred to as transistors ST. The signal line switching circuit ASW may also be referred to simply as switch circuit.

The transistor STR is connected to the signal line SLR. The transistor STG is connected to the signal line SLG. The transistor STB is connected to the signal line SLB.

The drive device DD of FIG. 1 controls the signal line drive circuit SLC, scan line drive circuit GLC, and signal line switching circuit ASW based on display control signals such as display data, clock signals, and display timing signals transmitted from outside the display unit.

The transistors STR, STG, and STB of the signal line switching circuit ASW are controlled on/off by the switching signals output from the drive device DD via the selection lines SSR, SSG, and SSB, respectively.

The drive device DD controls on/off of the transistors STR, STG, and STB of the signal line switching circuit ASW in accordance with the controlling by the signal line drive circuit SLC to output red video signal, green video signal, and blue video signal in a time-division manner within one horizontal period. That is, each transistor ST (STR, STG, and STB) in the signal line switching circuit ASW is driven in a time-division relationship. Specifically, to the signal line connected to an ON state transistor ST of the transistors STR, STG, and STB, the image signals from the signal line drive circuit SLC are input via the drawer lines WL1 and WL2. Furthermore, the drive device DD controls the scan line drive circuit GLC to maintain the ON state of the switching element PSW of the subpixel SX to which the video signal is written during the period when the video signal of each color is output.

The signal line switching circuit ASW may be referred to simply as RGB switch, time-division switch, analog switch, or selector. In the present embodiment, one signal line switching circuit is provided with the three signal lines connected to the red, green, and blue sub-pixels, but a signal line switching circuit may be provided for two signal lines connected to two sub-pixels. Alternatively, one signal line switching circuit may be provided for two pixels, that is, six signal lines connected to six sub-pixels. In this case, the signal line drive circuit outputs video signals six times in one horizontal period. The number of time divisions can be set arbitrarily according to the writing status of video signals to each subpixel and the processing capability of the signal line drive circuit.

During the display period including the horizontal period above, a constant direct current voltage is supplied from the common electrode drive circuit CD to the switch circuit MUX via the line VDCL. The switch circuit MUX supplies the constant DC voltage to all common electrodes CE via the common line CML. This generates an electric field which drives the liquid crystal layer LC between the pixel electrode PE and the common electrode CE as described above.

Next, the cross-sectional structure of the display device DSP in the pixel part will be explained with reference to FIG. 3.

As in the figure, the display device DSP includes a first substrate SUB1, second substrate SUB2 opposed to the first substrate SUB1 with a gap therebetween, and liquid crystal layer LC sealed between the substrates. The first substrate SUB1 includes a base material BA1, insulating layer UC, scan line GL, signal line SL, switching element PSW, insulating layer PLN1, insulating layer PLN2, common electrode CE, insulating layer PAS, pixel electrode PE1, and alignment film AL1. The switching element PSW includes a semiconductor layer SC, insulating layer GI, gate electrode GE formed integrally with the scan line GL, insulating layer ILI, and source electrode SL and drain electrode DE, each of which is formed integrally with the signal line SL, and therein the above components are layered in this order.

The base material BA1 is a light transmissive substrate such as a glass substrate or a flexible resin substrate. The insulating layer UC is positioned above the base material BA1. The light shielding layer LS is formed between the base material BA1 and the insulating layer UC. The light shielding layer LS overlaps with the scan line GL (gate electrode) with the semiconductor layer SC interposed therebetween. The insulating layer GI is located above the insulating layer UC. The insulating layer ILI is located above the insulating layer GI.

The insulating layers UC, GI, ILI, and PAS are inorganic insulating layers formed of inorganic insulating materials such as silicon oxide, silicon nitride, and silicon oxynitride. The insulating layers UC, GI, and ILI may have a single-layer structure using above inorganic insulating materials, or they may have a multilayer structure with multiple layers of above inorganic insulating material. On the other hand, the insulating layers PLN1 and PLN2 are organic insulating layers formed of organic insulating materials such as acrylic resin.

The semiconductor layer SC is disposed on the insulating layer UC. The semiconductor layer SC is formed of, for example, polycrystalline silicon. The semiconductor layer SC may be formed of amorphous silicon or oxide semiconductor.

The scan lines GL are disposed on the semiconductor layer SC and the insulating layer GI. The scan lines GL are formed of metal materials such as aluminum (Al), titanium (Ti), silver (Ag), molybdenum (Mo), tungsten (W), copper (Cu), and chromium (Cr), or alloys of a combination of aforementioned metal materials, and may have a single-layer or multilayer structure. For example, the scan lines GL are formed of a molybdenum-tungsten alloy. In the present embodiment, the line layer on the same layer as the scan lines GL will be referred to as first line layer Wg. The first line layer Wg may also be referred to as scan line layer, gate layer, or GL layer. Alternatively, the first line layer Wg may be referred to as first metal layer.

The signal line SL is located above the insulating layer ILI. The signal line SL is connected to the semiconductor layer SC through contact holes in the insulating layers GI and ILI. The signal line SL is formed of metal materials such as aluminum (Al), titanium (Ti), silver (Ag), molybdenum (Mo), tungsten (W), copper (Cu), and chromium (Cr), or an alloy of a combination of aforementioned materials, and may have a single-layer or multilayer structure. For example, the signal line SL is a layered structure in which a first layer containing titanium (Ti), second layer containing aluminum (Al), and third layer containing titanium (Ti) are layered in this order. In the present embodiment, the line layer on the same layer as the signal line SL will be referred to as second line layer Ws. Furthermore, the second line layer Ws may also be referred to as signal line layer, Sig layer, or SL layer. Alternatively, the second line layer Ws may also be referred to as the second metal layer.

The drain electrode DE is located above the insulating layer ILI. The drain electrode DE is connected to the semiconductor layer SC through contact holes in the insulating layers GI and ILI. The drain electrode DE is formed of the second line layer Ws.

The insulating layer PLN1 covers the signal line SL, drain electrode DE, and insulating layer ILI. The drawer electrode TE is disposed on the insulating layer PLN1 and is connected to the drain electrode DE through a contact hole in the insulating layer PLN1.

The drawer electrode TE may be formed of the aforementioned metal materials or alloys combining the aforementioned metal materials, and may have a single-layer or multilayer structure. For example, the drawer electrode TE is a layered structure including a first layer containing titanium (Ti), second layer containing aluminum (Al), and third layer containing titanium (Ti) layered in this order, or a layered structure including a first layer containing molybdenum (Mo), second layer containing aluminum (Al), and third layer containing molybdenum (Mo) layered in this order. The drawer electrode TE is formed of a line layer on the same layer as the common line CML. In the present embodiment, the line layer on the same layer as the common line CML may be referred to as third line layer Wt. Furthermore, the third line layer Wt may also be referred to as third metal layer.

An insulating layer PLN2 is disposed to cover the insulating layer PLN1 and the drawer electrode TE.

On the insulating layer PLN2, the common electrode CE and a relay electrode RE are disposed, where the relay electrode RE is located at the opening of the common electrode CE, and the common electrode CE and the relay electrode RE are apart from each other.

The relay electrode RE is located above the insulating layer PLN2. The relay electrode RE is in contact with the drawer electrode TE through a contact hole formed in the insulating layer PLN1 at the position where it overlaps with the draw electrode TE. The relay electrode RE is formed of the same transparent conductive material as the common electrode CE, such as indium tin oxide (ITO) or indium zinc oxide (IZO).

The insulating layer PAS covers the common electrode CE and the relay electrode RE.

The pixel electrode PE is located above the insulating layer PAS. The pixel electrode PE is covered with the alignment film AL1 That is, the pixel electrode PE is disposed between the insulating layer PAS and the alignment film AL1. The pixel electrode PE is a transparent electrode formed of the transparent conductive material described above, as with the common electrode CE.

The pixel electrode PE is connected to the relay electrode RE through a contact hole formed in the insulating layer PAS, and overlaps with the common electrode CE with the insulating layer PSA interposed therebetween.

The alignment film AL1 also covers the insulating layer PAS.

The second substrate SUB2 includes a base material BA2, light shielding layer BM, color filter CF, overcoat layer OC, and alignment film AL2.

The base material BA2 is, as with the base material BA1, a light transmissive substrate such as a glass substrate or a resin substrate. The light shielding layer BM and the color filter CF are located on the side of the base material BA2 opposed to the first substrate SUB1.

The color filter CF includes a red color filter CFR, green color filter CFG, and blue color filter CFB.

The overcoat layer OC covers the color filter CF. The overcoat layer OC is formed of a transparent resin.

The alignment film AL2 covers the overcoat layer OC. The alignment film AL1 and the alignment film AL2 are formed of, for example, a material that exhibits horizontal orientation.

The first substrate SUB1 and the second substrate SUB 2 mentioned above are arranged such that the alignment films AL1 and AL2 are opposed to each other. The first substrate SUB1 and the second substrate SUB2 are bonded by sealing with a predetermined cell gap formed therein. The liquid crystal layer LC is held between the alignment films AL1 and AL2. The liquid crystal layer LC includes a positive type (positive dielectric constant anisotropy) liquid crystal material or a negative type (negative dielectric constant anisotropy) liquid crystal material.

A polarizer PL1 is bonded to the base material BA1. A polarizer PL2 is bonded to the base material BA2. Note that, in addition to the polarizers PL1 and PL2, a retardation plate, scattering layer, antireflection layer, etc., may be provided.

The display device DSP includes an illumination device located below the first substrate SUB1, which is not shown.

Figure 4:
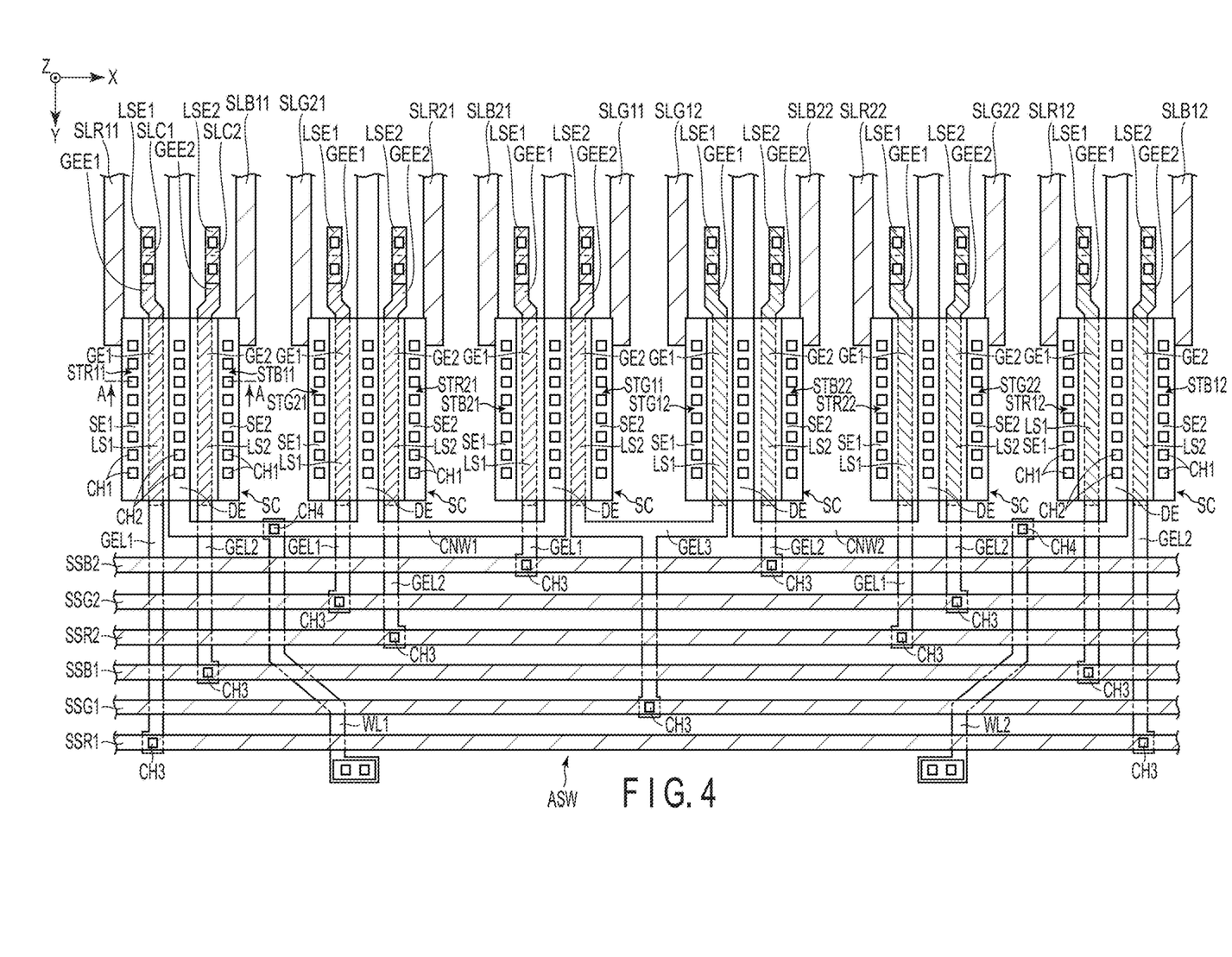
FIG. 4 is a schematic plan view illustrating a signal line switching circuit of the display device.
Figure 5:
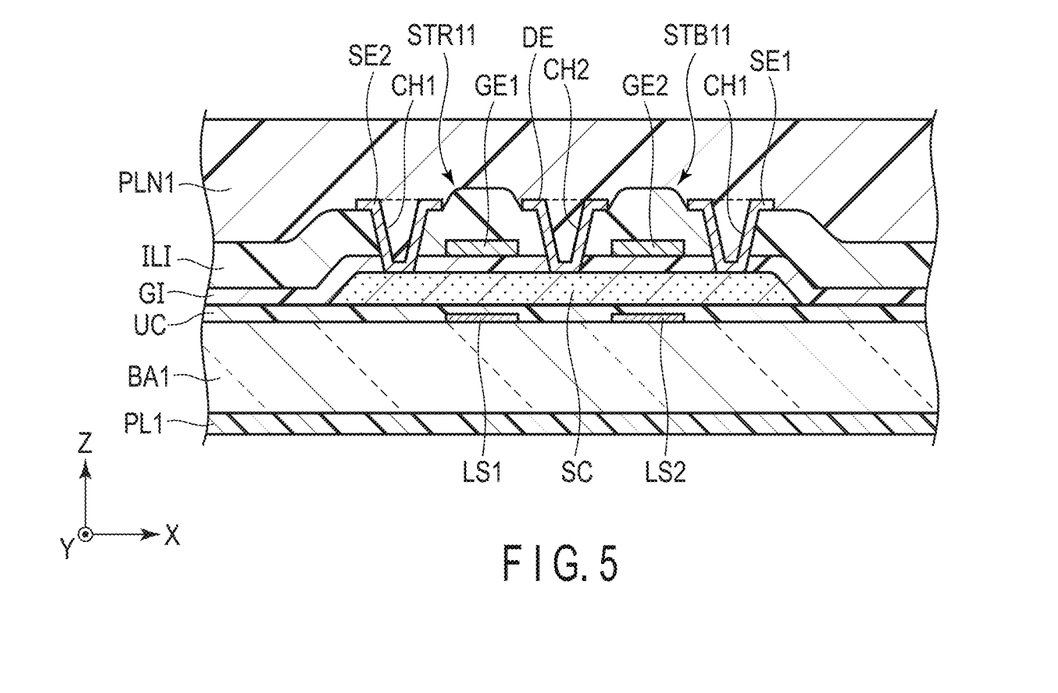
FIG. 5 is a cross-sectional view of a transistor, taken along line A-A of FIG. 4.

Next, the structure of the signal line switching circuit ASW will be described. FIG. 4 is a detailed plan view of the signal line switching circuit ASW, and FIG. 5 is a cross-sectional view of the transistor, taken along line A-A of FIG. 4. FIG. 4 illustrates an example of one of the two-row transistors of the signal line switching circuit ASW.

As in FIG. 4, the signal line switching circuit ASW includes, as selection lines (first lines) SSR, SSG, and SSB, selections lines SSR1, SSG1, SSB1, SSR2, SSG2, and SSB2. Note that, if there is no need of distinguishing the selection lines SSR1, SSG1, SSB1, SSR2, SSG2, and SSB2, the may be simply referred to as selection lines SS. The six selection lines SS each extend in the first direction X, and are arranged at intervals in the second direction Y. For example, the selection lines SSR1, SSG1, SSB1, SSR2, SSG2, and SSB2 are arranged in the second direction Y in this order. The selection lines SS are connected to the drive device DD. In FIG. 4, the selection lines are hatched.

The signal line switching circuit ASW includes connection lines CNW1 and CNW2. The connection lines CNW1 and CNW2 each extend in the first direction X and are apart from the selection line SSB2 in the second direction Y.

The signal line switching circuit ASW of FIG. 4 includes, as the transistors STR, STG, and STB, transistors STR11, STG11, STB11, STR12, STG12, STB 12, STR21, STG21, STB21, STR22, STG22, and STB22. When there is no need of distinguishing the above transistors individually, they will be referred to as transistors ST. The transistors ST are arranged at intervals in the first direction X and are arranged, with respect to the connection line CNW1, SNW2, and selection line SSB2 at intervals in the second direction Y.

In the present embodiment, two transistors are formed integrally using a common semiconductor layer and a common drain electrode.

For example, transistors STR11 and STB11, transistors STG21 and STR21, transistors STB21 and STG11, transistors STG12 and STB22, transistors STR 22 and STG22, and transistors STR12 and STB12 are formed integrally, respectively.

The transistors STR11 and STB11 include, for example, a rectangular semiconductor layer SC, a pair of source electrodes SE1 and SE2 disposed to overlap with the semiconductor layer SC with an insulating layer therebetween, common drain electrode located between the pair of source electrodes SE1 and SE2, and a pair of gate electrodes (first gate electrode, second gate electrode) GE1 and GE2 2 positioned between the drain electrode DE and each of the source electrodes SE1 and SE2 to overlap with the semiconductor layer SC with an insulating layer therebetween. The transistors STR11 and STB11 structure so-called dual gate transistors. The source electrodes SE1 and SE2, drain electrode DE, and pair of gate electrodes GE1 and GE2 extend in the second direction Y, respectively, and are spaced apart in the first direction X.

Each of the source electrodes SE1 and SE2 is connected to the semiconductor layer SC through a plurality of contact holes CH1 aligned at intervals in the second direction Y. The drain electrode DE is connected to the semiconductor layer SC through a plurality of contact holes CH2 aligned at intervals in the second direction Y.

Transistors STR11 and STB11 further include two light shielding layers (first light shielding layer and second light shielding layer) LS1 and LS2, which are conductive and function as a back gate. The light shielding layers LS1 and LS2 are disposed to overlap with the gate electrodes GE1 and GE2 via the semiconductor layer SC and the insulating layer, respectively. The light shielding layers LS1 and LS2 have a width approximately equal to that of the gate electrode GE, respectively, and extend from an end of the gate electrode GE to the other end thereof in the second direction Y. Note that, in FIG. 4, the light shielding layers LS1 and LS2 hatched.

The source electrode SE1 is formed integrally with the signal line SLR11. The signal line SLR11 extends from the source electrode SE1 in the second direction Y in the opposite direction to the selection line SSB, and is connected to the source electrode of the second-row transistor which is not shown. The source electrode SE2 is formed integrally with the signal line SLB11. The signal line SLB11 extends from the source electrode SE2 in the second direction Y in the opposite direction to the selection line SSB, and is connected to the source electrode of the second row which is not shown. In FIG. 4, the signal lines are hatched.

One end of the drain electrode DE in the selection line SSB side is connected line CNW1. The other end of the drain electrode DE in the opposite side of the selection line SSB extends in the second direction Y to be opposite to the selection line SSB, and is connected to the drain electrode in the second-row transistor, which is not shown.

One end of the gate electrode GE1 in the selection line SSB side is connected to a gate line (second line) GEL1 formed integrally with the gate electrode GE1. The gate line GEL1 extends from the transistor STR11 in the second direction Y to be aligned with the direction of the selection line SSB and is connected to the selection line SSR1 through the contact hole CH3. One end of the gate electrode GE2 in the selection line SSB side is connected to the gate line (second line) GEL2 formed integrally with the gate electrode GE2. The gate line GEL2 extends from the transistor STB11 in the second direction Y to be aligned with the direction of the selection line SSB and is connected to the selection line SSB1 through the contact hole CH3.

The gate electrode GE1 integrally includes an extension part GEE1 extending in the second direction Y for a predetermined length from the other end in the opposite side of the selection line SSB to be opposite to the selection line SSB in the direction. Similarly, the light shielding layer LS1 integrally includes an extension part LSE1 extending in the second direction Y for a predetermined length from the other end opposite to the selection line SSB to be opposite to the selection line SSB in the direction. The extension part LSE1 overlaps with the extension part GEE1 of the gate electrode GE1 through an insulating layer. The extension part LSE1 extends slightly longer than the extension part GEE1'. As will be described later, the extension part LSE1 of the light shielding layer LS1 is electrically connected to the extension part GEE1 of the gate electrode GE1 through the connection line SLC'. Thus, the light shielding layer LS1 is electrically connected to the gate electrode GE1, structuring the back gate.

The gate electrode GE2 integrally includes an extension part GEE2 extending from the other end opposite to the selection line SSB in the direction opposite to the selection line SSB in the second direction Y for a predetermined length. Similarly, the light shielding layer LS2 integrally includes an extension part LSE2 extending from the other end opposite to the selection line SSB in the direction opposite to the selection line SSB in the second direction Y for a predetermined length. The extension part LSE2 overlaps with the extension part GEE2 of the gate electrode GE2 through an insulating layer. The extension part LSE2 is slightly longer than the extension part GEE2. As described below, the extension part LSE2 of the light shielding layer LS2 is electrically connected to the extension part GEE2 of the gate electrode GE2 through the connection line SLC2. Thus, the light shielding layer LS2 is electrically connected to the gate electrode GE2, structuring the back gate.

FIG. 5 is a cross-sectional view of the transistor part, taken along line A-A of FIG. 4.

Figure 3:
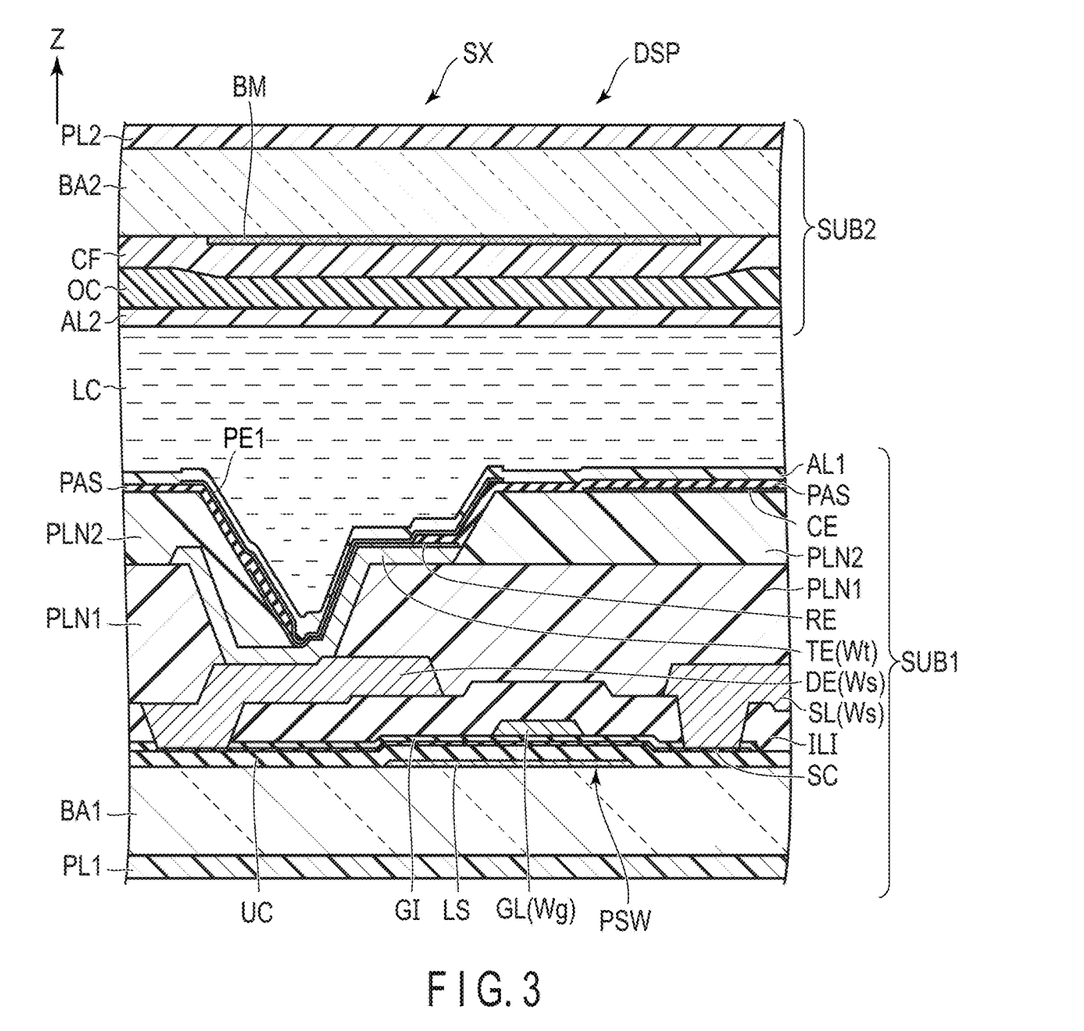
FIG. 3 is a cross-sectional view of the display device of the pixel portion.

As in the figure, the transistors STR11 and STB 11 have a substantially similar cross-sectional structure as the switching element PSW of subpixel SX of FIG. 3. Note that, the light shielding layers LS1 and LS2 of the transistor ST of FIG. 5 have the same shape and width as the gate electrodes GE1 and GE2. Thus, each side edge of the light shielding layers LS1 and LS2 has the same shape and width as that of the gate electrodes GE1 and GE2, and they overlap with each other in the third direction Z.

As in FIG. 5, the light shielding layers LS1 and LS2 are formed on the surface of the base material BA1, and an insulating layer UC is formed on the surface and the light shielding layers LS1 and LS2. A semiconductor layer SC and a gate insulating layer GI are layered over the insulating layer UC. The gate electrodes GE1 and GE2 are disposed on the gate insulating layer GI. The gate electrodes GE1 and GE2 overlap with the light shielding layers LS1 and LS2 with the insulating layers UC and GI and the semiconductor layer SC interposed therebetween. As mentioned above, the width of the light shielding layers LS1 and LS2 in the first direction X is substantially the same as the width of gate electrodes GE1 and GE2 in the first direction X, and each light shielding layer and gate electrode overlap with each other in an aligned state.

An insulating layer ILI is formed on the gate insulating layer GI and the gate electrodes GE1 and GE2, and the source electrodes SE1 and SE2 and the drain electrode DE are disposed on the insulating layer ILI. The source electrode SE1 is connected to the semiconductor layer SC through the contact hole CH1. Similarly, the source electrode SE2 is connected to the semiconductor layer SC through the contact hole CH1. The drain electrode DE is located between the source electrodes SE1 and SE2 and is connected to the semiconductor layer SC through the contact hole CH2.

The insulating layer ILI, source electrodes SE1 and SE2, and drain electrode DE are covered with the insulating layer PLN1.

The source electrodes (which may be referred to as signal lines) SE1 and SE2 and the gate electrodes (which may be referred to as gate lines or scan lines) GE1 and GE2 are formed of a metal material such as aluminum (Al), titanium (Ti), silver (Ag), molybdenum (Mo), tungsten (W), copper (Cu), and chromium (Cr), or an alloy combining such metal materials, and may have a single-layer structure or a multi-layer structure.

The light shielding layers LS1 and LS2 should be formed of a light-shielding metal material. Specifically, it is suitable that they are formed of the same material as the gate lines (scan lines).

Figure 6:
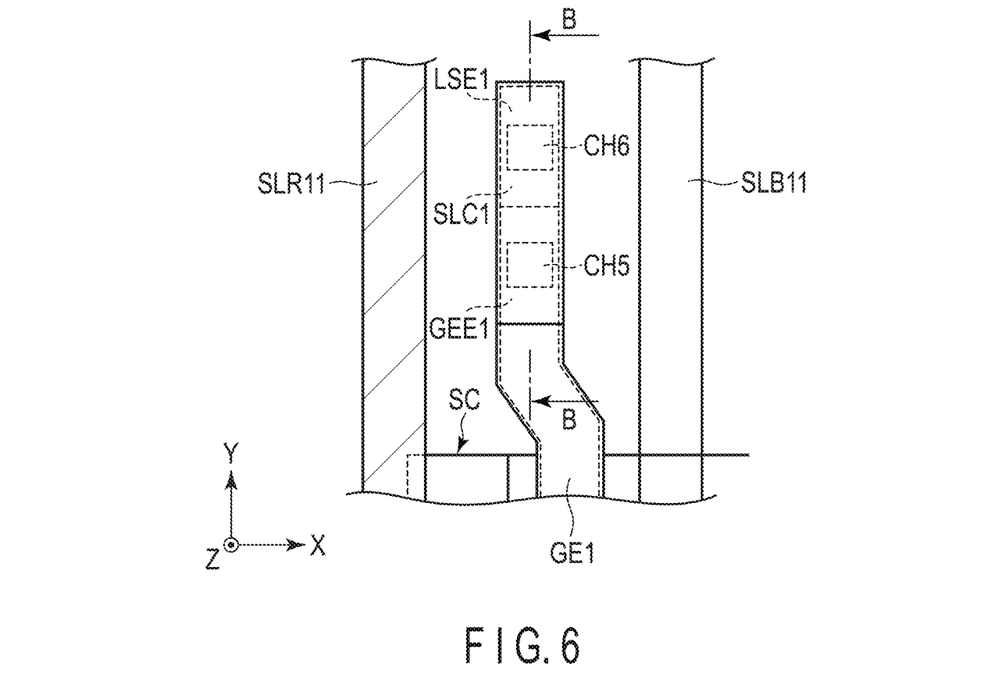
FIG. 6 is a plan view illustrating an extension part of a gate electrode of the transistor and an extension part of a light shielding layer in an enlarged manner.
Figure 7:
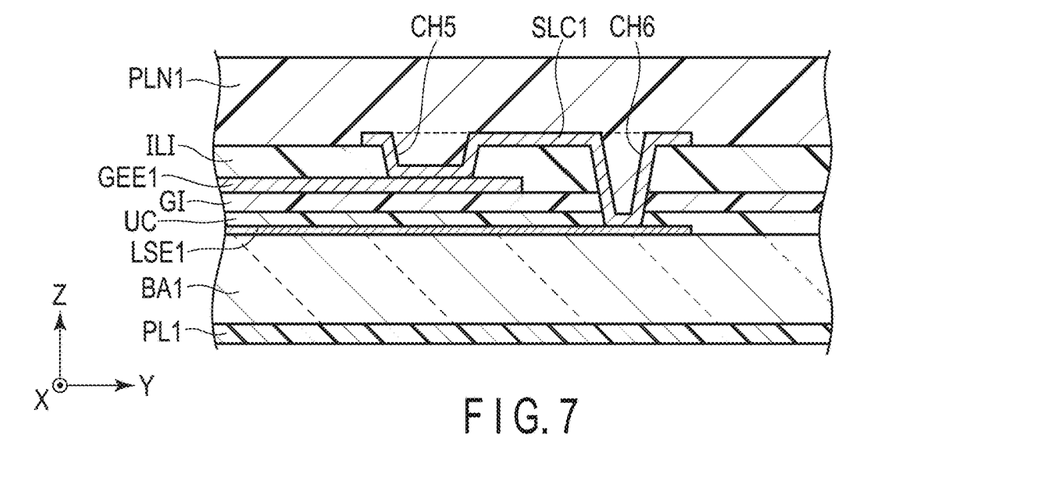
FIG. 7 is a cross-sectional view of the extension part, taken along line B-B of FIG. 6.

FIG. 6 is a plan view illustrating the extension part GEE1 of the gate electrode GE1 and the extension part LSE1 of the light shielding layer LS1. FIG. 7 is a cross-sectional view of the extension part, taken along line B-B of FIG. 6.

As in FIGS. 6 and 7, the light shielding layer LS1 and the extension part LSE1 thereof are formed on the base material BA1 and extend for a predetermined length in the second direction Y. The insulating layer US and the fate insulating layer GI are layered in this order to overlap with the light shielding layer LS1 and the extension part LSE1 thereof. The gate electrode GE1 and the extension part DEE1 are disposed to overlap with the gate insulating layer GI and extend for a predetermined length in the second direction Y. The width of the extension part LSE1 in the first direction X is substantially the same as the width of the extension part DEE1 in the first direction X, and the extension part LSE1 and the extension part DEE1 overlap with each other in an almost aligned manner with the insulating layers UC and GI interposed therebetween. Note that, the extension part LSE1 of the light shielding layer LS1 extends slightly longer than the extension part GEE1, and thus, the extension end of the extension part LSE1 does not overlap with the extension part GEE1.

The insulating layer ILI is layered to overlap with the gate electrode GE1, extension part GEE1, and gate insulating layer GI. The connection line SLC1 is overlaid on the insulating layer ILI, and overlaps with the extension ends of the extension part LSE1 and the extension part GEE'. The connection line SLC1 is formed of, for example, a metal layer in the same layer as the signal line SL. The connection line SLC1 is formed to have a substantially equal width to the width of the extension part LSE1 and the extension part GEE1 in the first direction X, and overlaps with the extension parts in an aligned manner. One end of the connection line SLC1 is connected to the extension part GEE1 through the contact hole CH5. The other end of the connection line SLC1 is connected to the extension end of the extension part LSE1 through the contact hole CH6. Thus, the extension part LSE1 of the light shielding layer LS is electrically connected to the extension part GEE1 of the gate electrode GE through the connection line SLC1. The insulating layer ILI and the connection line SLC1 are covered with the insulating layer PLN1.

Note that, the other extension parts LSE2 and GEE2 of the transistors STR11 and STB11 are formed similarly to the above-mentioned extension parts LSE1 and GEE1, and are electrically connected to each other by the connection line LSE2.

As can be understood from the above, by extending the extension part GEE of the gate electrode GE of the transistor ST and the extension part LSE of the light shielding layer LS in the direction opposite to the multiple selection lines SSB such that a contact part (connection line SLC) in which the extension ends thereof are electrically connected to each other by connection line is formed, and therefore, the extension parts GEE and LSE and the contact part can be placed in an empty area where there are no selection lines SSB. Thus, the contact part connecting the gate electrode and the light shielding layer is not placed over the multiple selection lines or other line, and disconnections caused by the contact part can be prevented. At the same time, the extension parts GEE, LSE, and contact part are disposed in an area where there are no selection lines SSB or drawer lines, unintentional decrease in capacitance can be suppressed.

By forming the light shielding layer LS and the extension part LSE overlapping with the gate electrode GE and extension part GEE in the same shape, the capacitance produced in the gate electrode and the capacitance produced in the light shielding layer LS can be set the same. Therefore, it is possible to improve the transistor characteristics.

As in FIG. 4, the other transistors STG21, STR21, transistors STB21 and STG11, transistors STG12 and STB22, transistors STR22 and STG22, transistors STR12 and STB12 are each configured the same as with the aforementioned transistors STR11 and STB11. Structural parts the same as those of the transistors STR11 and STB11 are shown with the same reference numbers put thereto. The transistors ST are arranged at certain intervals in the first direction.

Signal lines SLG21 and SLR21 extending from the source electrodes SE' and SE2 of the transistors STG21 and STR21 each extend in the second direction Y, and are connected to the source electrodes of the corresponding transistors in the second row. The drain electrode DE of the transistors STG21 and STR21 is connected to a connection line CNW1. The gate electrode GE1 of the transistor STG21 is connected to a selection line SSG2 through the gate line GEL'. The gate electrode GE2 of the transistor STR21 is connected to the selection line SSR2 through the gate line GEL2.

Signal lines SLB21 and SLG11 extending from the source electrodes SE1 and SE2 of the transistors STB21 and STG11 each extend in the second direction Y to be connected to the source electrodes of the corresponding transistors in the second row. The drain electrode DE of the transistors STB21 and STG11 is connected to the connection line CNW1. The gate electrode GE1 of the transistor STB21 is connected to the selection line SSB2 through the gate line GEL1. The gate electrode GE2 of the transistor STG11 is connected to the selection line SSG1 via the gate line GEL3.

The connection line CNW1 is connected to the drawer line WL1 via contact hole CH4, and is connected to the signal line drive circuit SLC via the drawer line WL1.

Signal lines SLG12 and SLB22 extending from the source electrodes SE1 and SE2 of the transistors STG12 and STB22 each extend in the second direction Y to be connected to the source electrodes of the corresponding transistors in the second row. The drain electrode DE of the transistors STG12 and STB22 is connected to the connection line CNW2. The gate electrode GE1 of the transistor STG12 is connected to the selection line SSG1 through the common gate line GEL3. The gate electrode GE2 of the transistor STB22 is connected to the selection line SSB2 via the gate line GEL2.

Signal lines SLR22 and SLG22 extending from the source electrodes SE1 and SE2 of the transistors STR22 and STG22 each extend in the second direction Y to be connected to the source electrodes of the corresponding transistors in the second row. The drain electrode DE of the transistors STR22 and STG22 is connected to the connection line CNW2. The gate electrode GE1 of the transistor STR22 is connected to the selection line SSR2 through the gate line GEL1. The gate electrode GE2 of the transistor STB22 is connected to the selection line SSG2 via the gate line GEL2.

Signal lines SLR12 and SLB12 extending from the source electrodes SE1 and SE2 of the transistors STR12 and STB12 each extend in the second direction Y to be connected to the source electrodes of the corresponding transistors in the second row. The drain electrode DE of the transistors STR12 and STB12 is connected to the connection line CNW2. The gate electrode GE1 of the transistor STR12 is connected to the selection line SSR1 through the gate line GEL1. The gate electrode GE2 of the transistor STB12 is connected to the selection line SSB1 via the gate line GEL2.

The connection line CNW2 is connected to the drawer line WL2 via contact hole CH4, and is connected to the signal line drive circuit SLC via the drawer line WL2.

In any of other transistors STG21 and STR21, transistors STB21 and STG11, transistors STG12 and STB22, transistors STR22 and STG22, transistors STR12 and STB12, the extension parts GEE1 and GEE2 of the gate electrode GE and the extension parts LSE1 and LSE2 of the light shielding layer LS extend in the second direction Y to be opposite to the selection line SSB where extension ends are electrically connected to each other by the connection lines.

According to the first embodiment structured as described above, by extending the extension part GEE of the gate electrode GE of the transistor ST and the extension part LSE of the light shielding layer LS in the direction opposite to the multiple selection lines SSB such that a contact part in which the extension ends thereof are electrically connected to each other by connection line is formed, and therefore, the extension parts GEE and LSE and the contact part can be placed in an empty area where there are no selection lines SSB. Thus, the contact part connecting the gate electrode and the light shielding layer is not placed over the multiple selection lines or other lines, and disconnections caused by the contact part can be prevented. At the same time, the extension parts GEE, LSE, and contact part are disposed in an area where there are no selection lines SSB or drawer lines, unintentional decrease in capacitance can be suppressed.

As can be understood from the above, the first embodiment can present a display device which can suppress disconnections in the lines, and thus improve reliability.

Next, a signal line switching circuit of a display device according to other embodiments will be described. In the embodiments described below, the same reference numbers as in the first embodiment described above will be put to the same structural elements as in the first embodiment, and the detailed description may be omitted or simplified.

Second Embodiment

Figure 8:
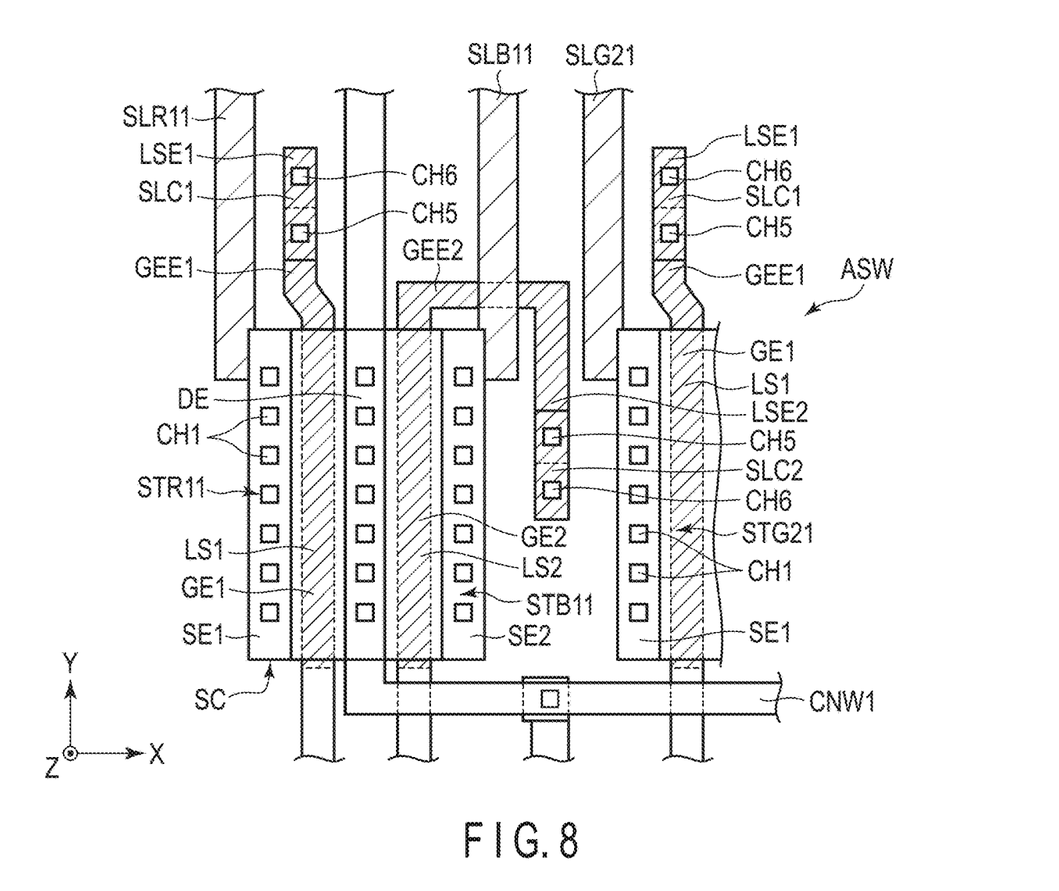
FIG. 8 is a plan view illustrating a part of a signal line switching circuit of a display device of a second embodiment.

FIG. 8 is a plan view illustrating a part of the signal line switching circuit of a display device of a second embodiment.

As illustrated in the figure, according to the second embodiment, in a signal line switching circuit ASW, one of two gate electrodes GE1 and GE2 of transistor ST, for example, an extension part GEE2 of the gate electrode GE2 is extended from the edge of gate electrode GE2 in the second direction Y for a predetermined length to be opposite to a selection line SSB, and then, further extended in the first direction X and the second direction Y to reach an empty area between two adjacent transistors ST. Similarly, an extension part LSE2 of the light shielding layer LS extends from the edge opposite the selection line SSB in the second direction Y for a predetermined length to be opposite to the selection line SSB, and then further extended in the first direction X and the second direction Y to reach an empty area between two adjacent transistors ST. The extension part LSE2 is, except for the extension end, aligned with an extension part GEE2 of a gate electrode DE2 and overlaps with the extension part GEE2 with an insulating layer interposed therebetween.

The extension end of the extension part LSE2 and the extension end of the extension part GEE2 are electrically connected to each other through a connection line SLC2. A contact part including the connection line SLC2 is positioned in an empty area between two adjacent transistors ST.

In the second embodiment, the other structures of the signal line switching circuit ASW are the same as those of the signal line switching circuit ASW of the first embodiment described above.

According to the second embodiment structured as described above, by arranging the extension parts GEE and LSE and the contact part in an empty area between transistors where there are no multiple lines, disconnections caused by the contact part and the like can be prevented. At the same time, the extension parts GEE and LSE, and contact part are disposed in an area where there are no selection lines SSB or drawer lines, unintentional decrease in capacitance can be suppressed. Furthermore, since the upper space of the transistors in the second direction Y is freed, and the free space can be utilized for a difference use.

As can be understood from the above, the second embodiment can present a display device which can suppress disconnections in the lines, and thus improve reliability.

Third Embodiment

Figure 9:
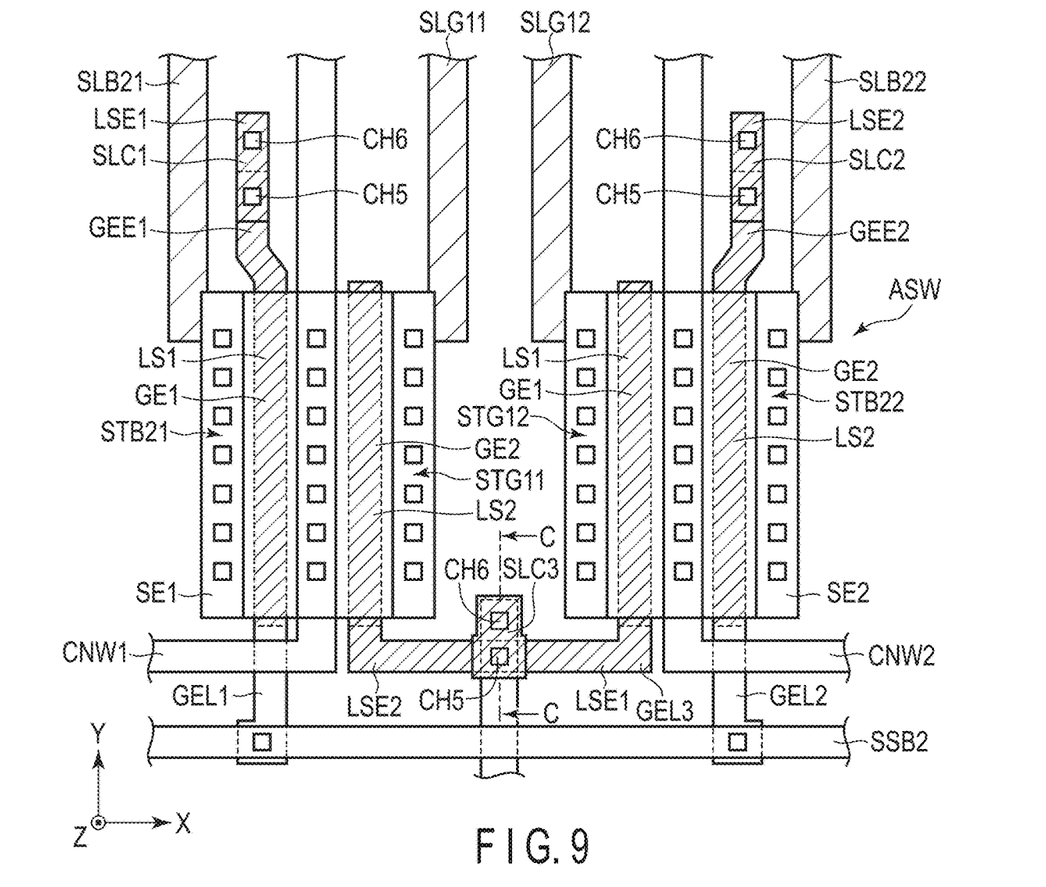
FIG. 9 is a plan view illustrating a part of a signal line switching circuit of a display device of a third embodiment.
Figure 10:
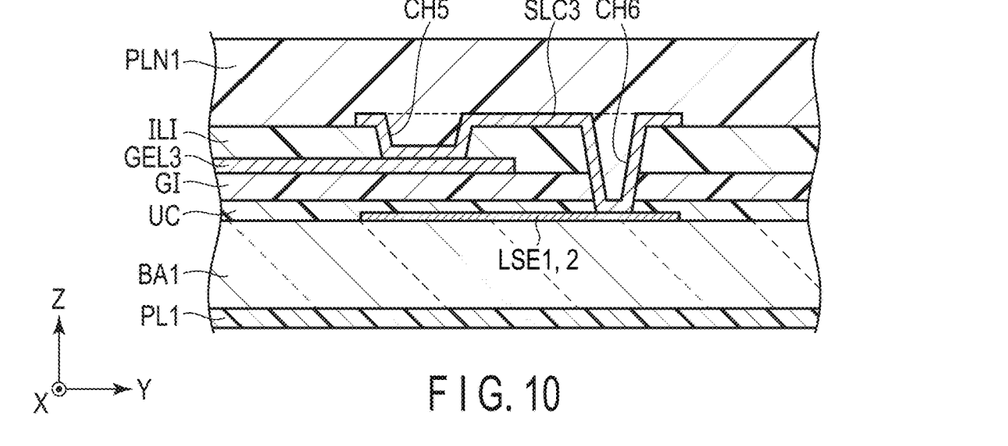
FIG. 10 is a cross-sectional view of a connection part, taken along line C-C of FIG. 9.

FIG. 9 is a plan view illustrating a part of a signal line switching circuit of a display device of a third embodiment. FIG. 10 is a cross-sectional view of a contact part, taken along line C-C of FIG. 9.

As in FIG. 10, in a signal line switching circuit ASW, as to two transistors adjacent to each other at an interval, for example, transistors STB21 and STG11 and transistors STG12 and STB22, an end of gate electrode GE2 and an end of gate electrode GE1 are connected to a selection line through a common gate line GEL3. In the third embodiment, in such transistors STG11 and STG12, the gate electrode DE2 of the transistor STG11 does not include an extension part extending from the end opposite to a selection line SSB in the second direction Y, but instead includes a gate line GDL3 extending from an end in the selection line SSB side of the gate electrode DE2 as an extension part. Similarly, the gate electrode GE1 of the transistor STG12 does not include an extension part extending from the end opposite to the selection line SSB in the second direction Y, but instead includes a gate line GDL3 extending from an end in the selection line SSB side of the gate electrode GE1 as an extension part.

A light shielding layer LS2 of a transistor STG11 includes an extension part LSE2 extending in the second direction Y and the first direction X along the gate line GEL3 from the end in the selection line SSB side. The extension part LSE2 includes an extension end extending from the gate line GEL3 in the second direction Y toward an empty space between the transistors STG1 and STG2.

A light shielding layer LS1 of a transistor STG12 includes an extension part LSE1 extending in the second direction Y and the first direction X along the gate line GEL3 from the end in the selection line SSB side. The extension part LSE1 is connected to the extension part LSE2. That is, the extension part LSE1 is formed integrally with the extension part LSE2.

The extension parts LSE1 and LSE2 are disposed to overlap with the gate line GEL3 with an insulating layer interposed therebetween, and the extension end alone is shifted from the gate line GEL3 to extend to an area between transistors.

As in FIG. 10, an insulating layer US and a gate insulating layer GI are layered in this order on the light shielding layer LS and extension parts LSE1 and LSE2 thereof. The gate electrode and the gate line GDL3 are overlaid on the gate insulating layer GI. The extension ends of the extension parts LSE1 and LSE2 extend in the second direction Y than does the gate line GEL3, and does not overlap with the gate line DEL2.

The insulating layer ILI is layered to overlap with the gate line GEL3 and the gate insulating layer GI. The connection line SLC3 is overlaid on the insulating layer ILI, and overlaps with the extension ends of the extension parts LSE1 and LSE2 and the gate line GEL3. The connection line SLC3 is formed of, for example, a metal layer in the same layer as the signal line SL. The connection line SLC1 is formed to have a substantially equal width to the width of the extension end of the light shielding layer in the first direction X, and overlaps with the extension end in an aligned manner. One end of the connection line SLC3 is connected to the gate line GEL3 through a contact hole CH5. The other end of the connection line SLC3 is connected to the extension ends LSE1 and LSE2 of the light shielding layer through the contact hole CH6. Thus, the extension parts LSE1 and LSE2 of the light shielding layers LS1 an LS2 are electrically connected to the extension part GEE1 of the gate electrodes GE1 and GE2 through the connection line SLC3 and the gate line GEL3. The insulating layer ILI and the connection line SLC1 are covered with the insulating layer PLN1.

In the third embodiment, the other structures of the signal line switching circuit ASW are the same as those of the signal line switching circuit ASW of the first embodiment described above.

According to the third embodiment structured as described above, by arranging the contact part connecting the gate electrode GE and the light shielding layer LS in an empty area between transistors where there are no multiple lines, disconnections caused by the contact part and the like can be prevented. Furthermore, since the upper space of the transistors in the second direction Y is freed, and the free space can be utilized for a difference use.

As can be understood from the above, the third embodiment can present a display device which can suppress disconnections in the lines, and thus improve reliability.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

All structures that can be designed and modified by a person skilled in the art based on each of the above-described structures as embodiments of the invention also fall within the scope of the invention, as long as they encompass the gist of the invention.

For example, each transistor of the signal line switching circuit is not limited to a dual-gate transistor, but may be a single transistor or a transmission gate, etc. The number of transistors and the number of lines can be changed in various ways according to a design adopted.

Although the embodiment describes a liquid crystal display as an example of a display device DSP, the embodiment is not limited thereto, and is applicable to, for example, electrophoretic display devices, organic electroluminescence (EL) display device, plasma display device, and micro-electromechanical systems (MEMS) display devices.

What is claimed is:

1. A display device comprising:
a display area;
a plurality of signal lines in the display area; and
a signal line switching circuit connected to the signal lines and located outside the display area, wherein
the signal line switching circuit comprises a plurality of first lines, a plurality of transistors, and a plurality of second lines,
the plurality of first lines each extends in a first direction and are disposed at intervals in a second direction intersecting the first direction, the plurality of transistors are located outside of the display area, apart from the first lines in the second direction and arranged in the first direction, each of the plurality of transistors includes a gate electrode and a light shielding layer disposed to overlap with the gate electrode, and the plurality of second lines connect the transistors to the first lines, and
the light shielding layer of the transistor includes an extension part extending from the light shielding layer to an area where the first line does not exist, and the extension part of the light shielding layer is electrically connected to the gate electrode.

2. The display device of claim 1, wherein
the extension part of the light shielding layer extends from the light shielding layer in the second direction in an opposite direction to the first line,
the gate electrode includes an extension part extending from the gate electrode in the second direction in an opposite direction to the first line and overlapping the extension part of the light shielding layer, and
the extension part of the light shielding layer is electrically connected to the extension part of the gate electrode.

3. The display device of claim 2, wherein
the extension part of the light shielding layer and the extension part of the gate electrode are formed to extend in an area between two of the transistors adjacent to each other in the first direction, and are electrically connected to each other in the area between the transistors.

4. The display device of claim 1, wherein
the second lines include a connection line disposed between the transistors and the first line to connect the gate electrodes of the two of the transistors adjacent to each other in the first direction, and
the extension part of the light shielding layer extends from the light shielding layer along the connection line to overlap therewith, and includes an extension end extending from a position overlapping with the connection line to the area between the two of the transistors, and is electrically connected to the connection line in a position of the extension end.

5. The display device of claim 1, wherein
the transistor includes a semiconductor layer, a pair of source electrodes opposed to the semiconductor layer with an insulating layer therebetween, a drain electrode positioned between the pair of source electrodes and opposed to the semiconductor layer with the insulating layer therebetween, a first gate electrode positioned between one of the source electrode and the drain electrode and opposed to the semiconductor layer with the insulating layer therebetween, and a second gate electrode positioned between the other source electrode and the drain electrode and opposed to the semiconductor layer with the insulating layer therebetween, and
the light shielding layer includes a first light shielding layer overlapping with the first gate electrode with the semiconductor layer and the insulating layer therebetween, and a second light shielding layer overlapping with the second gate electrode with the semiconductor layer and the insulating layer therebetween.

6. A display device comprising:
a plurality of signal lines; and
a signal line switching circuit connected to the signal lines, wherein
the signal line switching circuit comprises a plurality of first lines each extending in a first direction and disposed at intervals in a second direction intersecting the first direction, a plurality of transistors apart from the first lines in the second direction and arranged in the first direction, each transistor including a gate electrode and a light shielding layer disposed to overlap with the gate electrode, and a plurality of second lines connecting the transistors to the first lines, and
the light shielding layer of the transistor includes an extension part extending from the light shielding layer in the second direction in an opposite direction to the first line to an area where the first line does not exist,
the gate electrode includes an extension part extending from the gate electrode in the second direction in an opposite direction to the first line and overlapping the extension part of the light shielding layer, and
the extension part of the light shielding layer and the extension part of the gate electrode are formed to extend in an area between two of the transistors adjacent to each other in the first direction, and are electrically connected to each other in the area between the transistors.

7. A display device comprising:
a plurality of signal lines; and
a signal line switching circuit connected to the signal lines, wherein
the signal line switching circuit comprises a plurality of first lines each extending in a first direction and disposed at intervals in a second direction intersecting the first direction, a plurality of transistors apart from the first lines in the second direction and arranged in the first direction, each transistor including a gate electrode and a light shielding layer disposed to overlap with the gate electrode, and a plurality of second lines connecting the transistors to the first lines,
the light shielding layer of the transistor includes an extension part extending from the light shielding layer to an area where the first line does not exist, and is electrically connected to the gate electrode at a position of the extension part of the light shielding layer,
the second lines include a connection line disposed between the transistors and the first line to connect the gate electrodes of the two of the transistors adjacent to each other in the first direction, and
the extension part of the light shielding layer extends from the light shielding layer along the connection line to overlap therewith, and includes an extension end extending from a position overlapping with the connection line to the area between the two of the transistors, and is electrically connected to the connection line in a position of the extension end.

* * * * *